United States Patent [19]

Folmsbee et al.

[11] 4,441,170
[45] Apr. 3, 1984

[54] MEMORY REDUNDANCY APPARATUS FOR SINGLE CHIP MEMORIES

[75] Inventors: Alan C. Folmsbee, Santa Clara; Kim Kokkonen, Campbell; William J. Spaw, Moss Beach, all of Calif.

[73] Assignee: Intel Corporation, Santa Clara, Calif.

[21] Appl. No.: 320,600

[22] Filed: Nov. 12, 1981

Related U.S. Application Data

[63] Continuation-in-part of Ser. No. 192,494, Sep. 30, 1980, Pat. No. 4,358,833.

[51] Int. Cl.³ ............................................. G11C 7/00
[52] U.S. Cl. ..................................... 365/200; 371/10
[58] Field of Search ........................... 365/200; 371/10

[56] References Cited

U.S. PATENT DOCUMENTS

| | | | |
|---|---|---|---|
| 4,051,354 | 9/1977 | Choate | 365/200 |
| 4,281,398 | 7/1981 | McKenny et al. | 365/200 |
| 4,358,833 | 11/1982 | Folmsbee et al. | 365/200 |

*Primary Examiner*—George G. Stellar
*Attorney, Agent, or Firm*—Blakely, Sokoloff, Taylor & Zafman

[57] ABSTRACT

An improved addressing means for single chip memories which include a plurality of redundant lines and associated cells is described. Y address signals are used during programming to select and program redundant X decoders. The redundancy apparatus is implemented without any additional package pins and programming may be performed after packaging. The apparatus includes means for permanently disabling further programming of the redundancy circuitry to prevent inadvertent programming by a user.

17 Claims, 6 Drawing Figures

4,441,170

MEMORY REDUNDANCY APPARATUS FOR SINGLE CHIP MEMORIES

This is a continuation-in-part application of Ser. No. 192,494 filed Sept. 30, 1980 for MEMORY REDUNDANCY APPARATUS FOR SINGLE CHIP MEMORIES, now U.S. Pat. No. 4,358,833.

BACKGROUND OF THE INVENTION

1. Field of the Invention

The invention relates to the field of redundant circuits, particularly for use in single chip memories.

2. Prior Art

It is well known to use redundant memory circuits on a systems level to increase reliability, and on a chip-level to improve production yields. See U.S. Pat. Nos. 4,047,163; 4,250,507 and "Circuit Implementation of Fusible Redundant Addresses on RAMs for Productivity Enhancement", *IBM J. Res. Develop.* Volume 24 No. 3, May 1980 by Fitzgerald and Thoma for discussions concerning chip level redundancy.

In some memories with redundant cells, faulty cells are first identified during probe testing of the wafer and then fuses are blown to allow selection of the redundant cells. In some cases, particularly on dynamic RAMs and EPROMs, it is preferable to select redundant cells after the chip has been packaged since faulty cells are often first detected after the chip has been packaged. As will be seen, the present invention provides a redundancy apparatus which permits selection of redundant cells after the chip has been packaged. Importantly, no extra package pins are required for the programming operation used to permanently select the redundant cells which replace the defective cells.

One problem area which arises where redundancy programming is possible at the package level, is that the user may inadvertently reprogram the redundancy circuits. Such inadvertent programming could cause a user, for example, to permanently select a faulty redundant line, or cause other problems. The present invention provides a mechanism for permanently disabling the programming circuitry, thus preventing a user from inadvertently programming or reprogramming.

SUMMARY OF THE INVENTION

The improved redundancy apparatus of the present invention is particularly useful in memories where first address signals are used to select first lines in an array such as row lines, and second address signals are used to select second lines, such as bit lines. The improvement includes a plurality of redundant row lines. Programmable decoding means are included for selecting the redundant row lines upon receipt by the memory of predetermined row address signals. These row address signals correspond to the addresses of the faulty row lines. The apparatus includes selection means which receives the address signals for the second lines (e.g., bit lines). This selection means selects the programmable decoding means during the programming operation, and includes a mechanism for preventing further programming. In this manner, once the faulty lines in the array have been replaced with redundant lines, further inadvertent programming is permanently inhibited.

When a redundant row is selected, all non-relevant rows are deselected.

The apparatus can be used for redundant rows as described above, or for redundant columns by selecting the programmable decoding means with the row addresses.

DETAILED DESCRIPTION OF THE INVENTION

A redundancy apparatus which permits the selection of redundant lines (and associated cells) in an MOS memory is disclosed. In the following description, numerous specific details, such as specific address arrangements, etc., are set forth in order to provide a thorough understanding of the present invention. However, it will be obvious to one skilled in the art that these specific details are not required to practice the present invention. In other instances, well-known circuits are shown in block diagram form in order not to obscure the present invention in unnecessary detail.

Figure 1:
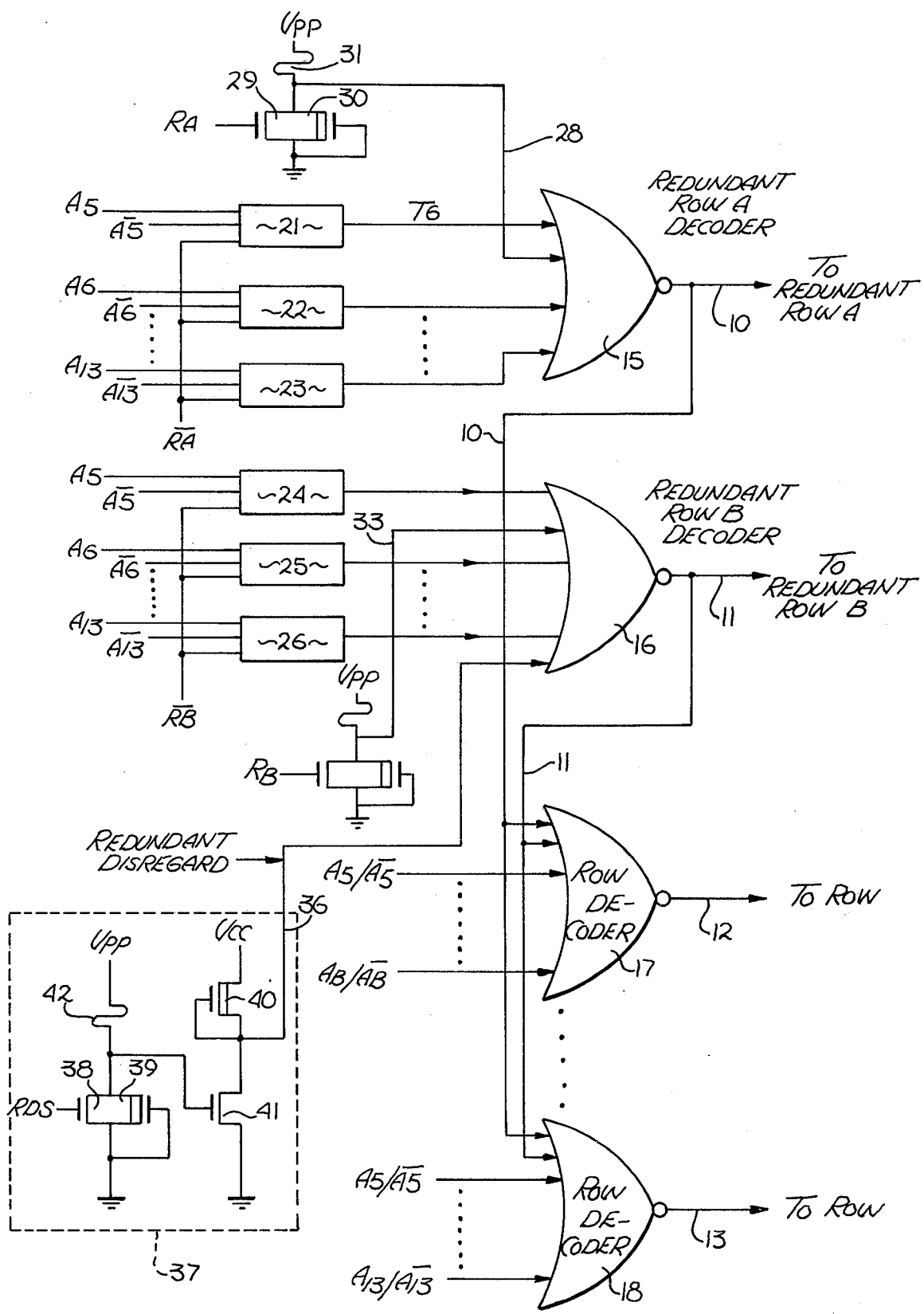
FIG. 1 is a block diagram showing the general layout of the redundant row decoders and their coupling to the normal row decoders and other circuitry associated with the redundancy apparatus of the present invention.
Figure 2:
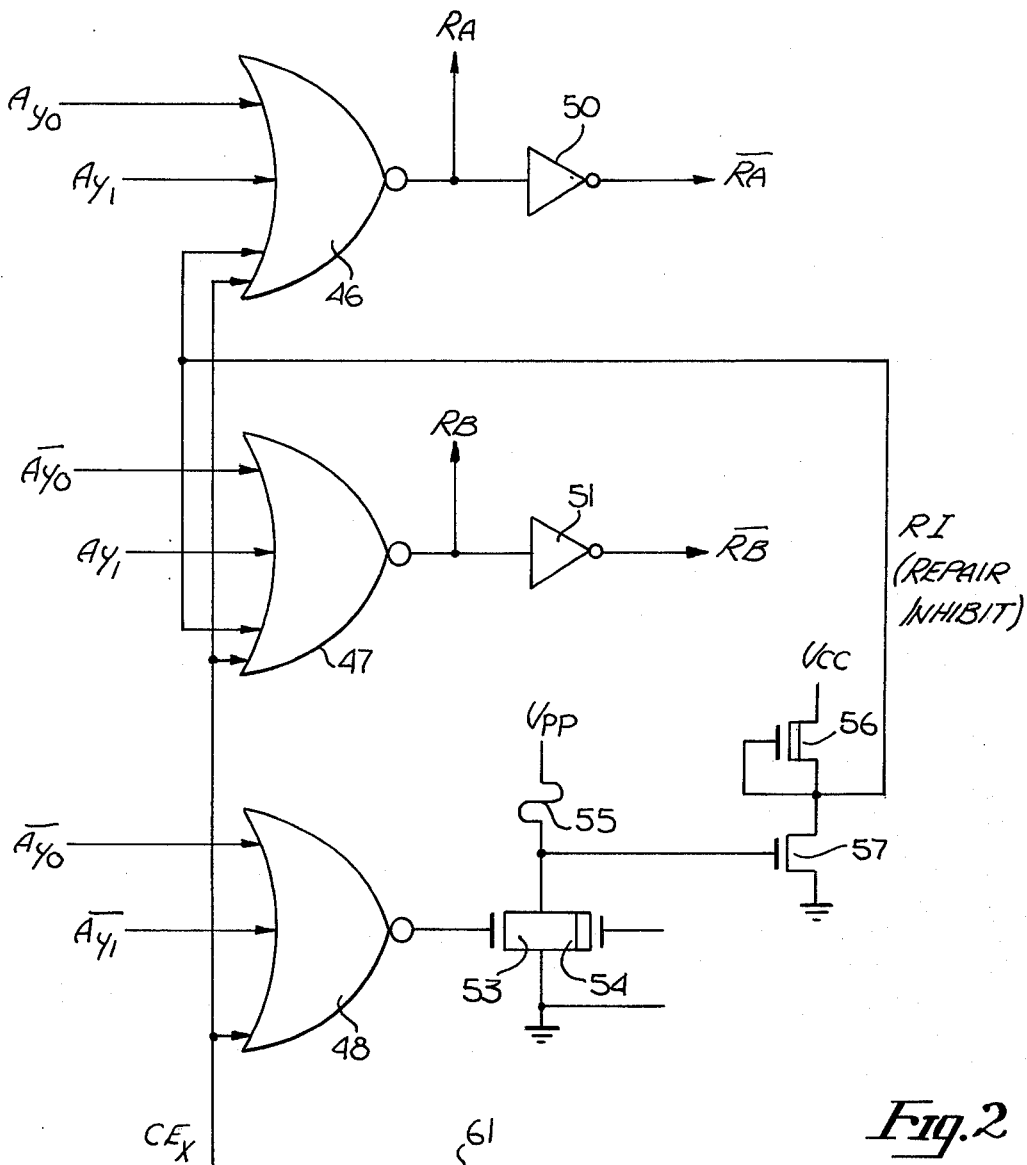
FIG. 2 is an electrical schematic of the circuitry used to select a particular programmable decoder for programming.
Figure 2:
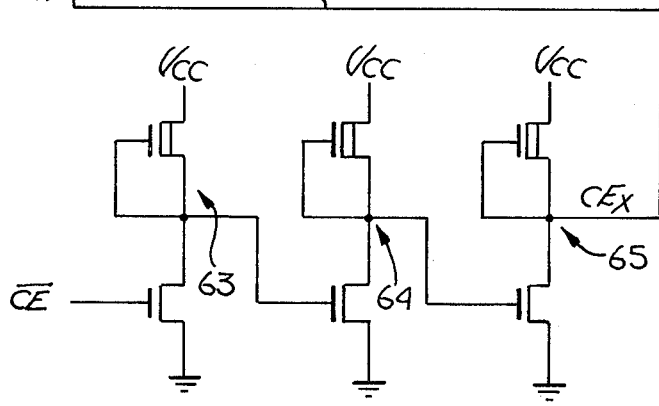
Figure 3:
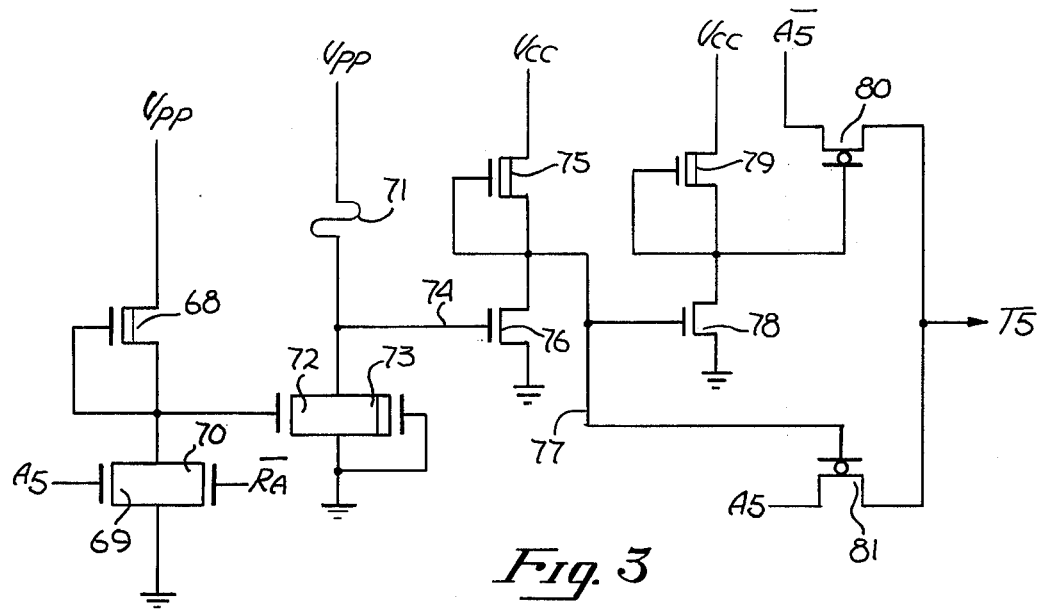
FIG. 3 is an electrical schematic of a programmable buffer used in the present invention.
Figure 6:
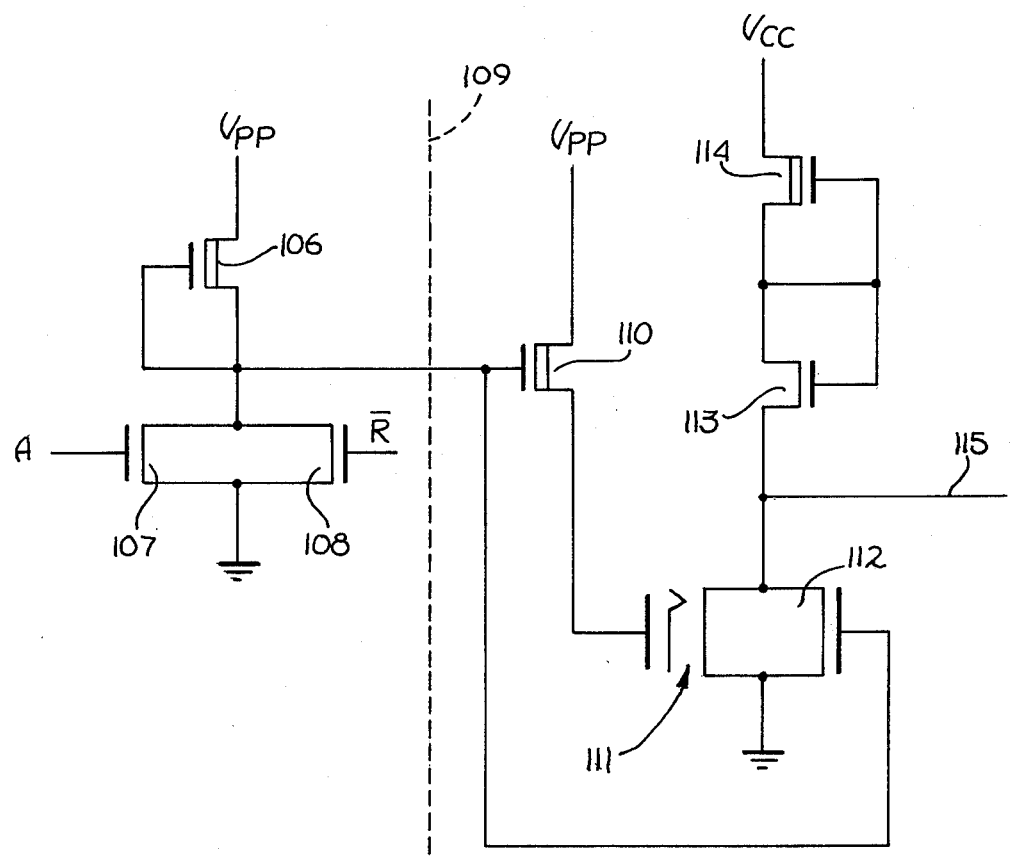
FIG. 6 is a circuit diagram of an alternate embodiment of a programmable circuit which employs an electrically programmable and electrically erasable memory cell.

The redundancy apparatus of the present invention may be used with random-access memories (RAMs), electrically programmable read-only memories (EPROMs), electrically programmable and electrically erasable read-only memories ($E^2$PROMs), and other memories. The circuitry shown in FIGS. 1 through 3 is directed to an EPROM and particularly, an EPROM employing floating gate memory devices. Such EPROMs use a potential of approximately 20 volts ($V_{pp}$) for the programming of the memory cells. This higher potential is also used to blow fuses during the programming of the redundancy circuitry of the present invention. During non-memory-programming operation of these memories, $V_{pp}$ is held at the $V_{cc}$ potential (approximately 5 volts for the n-channel field-effect transistors employed in the presently preferred embodiment.) The circuit of FIG. 6 is directed to an $E^2$PROM which also uses the $V_{pp}$ programming potential. For RAMs and other memories which do not have the $V_{pp}$ potential, during the programming of the fuses, $V_{cc}$ is raised as high as possible (without damaging any of the devices of the memory), for example, to 9 volts for n-channel MOS devices. This is sufficient potential to blow the fuses.

In the presently preferred embodiment, the redundancy circuit includes a plurality of polysilicon fuses which are selectively blown (opened) to provide programming. These fuses have a resistance of approximately 150 ohms and require 30 ma to blow. Approximately 9 volts is sufficient for a period of 10 msec. to blow a fuse. These fuses are described in U.S. Pat. No. 3,792,319 entitled "Polycrystalline Silicon Fusible Line for Programming Read-Only Memories".

For purposes of explanation, it is assumed for FIG. 1 that the memory includes two redundant (extra) row lines. The row lines include memory cells which are used to replace faulty cells within the memory array. Redundant row A is selected by an ordinary decoder which is shown as a NOR gate 15. The output of this NOR gate (line 10) selects the redundant row A. Similarly, for the redundant row B, decoder 16 selects the redundant row B (line 11). The redundant row decoders such as decoders 15 and 16 may be identical to the regular decoders used in the memory such as decoders 17 and 18 which select lines 12 and 13, respectively. The decoders 17 and 18 and all the regular row decoders each receive a different combination of the row address signals and their complements (shown as $A_5$ through $A_{13}$ and their complements). The regular row decoders 17 and 18 also receive as an input, an output signal from the redundant row decoders 15 and 16. Thus, line 10 is coupled to the input of the decoders 17 and 18, and likewise, line 11 is coupled to the input of the decoders 17 and 18. If redundant row A or B is selected, all the regular rows in the array are deselected. This prevents the selection of a faulty normal row when the address for that row is applied to the memory.

Each of the redundant row decoders receives input signals from programmable buffers, such as buffers 21 through 26. (Buffer 21 is shown in detail in FIG. 3.) Each of these identical buffers for each redundant row decoder receives a different row address signal and its complement. For example, buffer 21 receives $A_5$ and $A_5/$, buffer 22, $A_6$ and $A_6/$, etc., and similarly, buffer 24 for the decoder 16 receives the signals $A_5$ and $A_5/$, and so on. The buffers associated with the decoder 15 also receive a signal $R_A/$, and the decoders associated with the decoder 16 receive a signal $R_B/$. These signals allow the selection of the buffers associated with a single decoder for programming purposes. The generation of these signals shall be discussed in conjunction with FIG. 2.

When a faulty row is identified in the array, the buffers 21 through 23 are programmed so as to recognize the address of the faulty row, and upon receipt of this address provide all low signals to the decoder 15. This, in turn, (provided the signal on line 28 is low) provides a high output on line 10 selecting row A in lieu of the faulty row. Each faulty row in the array is replaced with a redundant row, provided there are a sufficient number of redundant rows.

If there are no faulty rows, or if there are more redundant rows than faulty rows, it is necessary to prevent the selection of unused, redundant rows. Assume, for example, that there are no faulty rows in the array, and therefore, row 10 is not to be selected by any address. The signal on line 28 which is coupled to the decoder 15 prevents the selection or the row A. Line 28 is coupled to $V_{pp}$ through fuse 31, and to ground through the parallel combination of the enhancement mode transistor 29 and a depletion mode transistor 30. The transistor 29 is relatively large, and when it conducts, it draws sufficient current from $V_{pp}$ to blow the fuse 31. The transistor 30 is relatively small when compared to transistor 29 and assures that line 28 remains at ground potential when the fuse 31 is blown. The gate of transistor 29 is coupled to the $R_A$ signal. This signal is brought high during the programming of the buffers associated with the decoder 15, namely, buffers 21 through 23. If these buffers are not programmed (meaning row A is not to be used), transistor 29 never conducts. The fuse 31 then remains intact, and a positive potential is always coupled to line 28. The positive potential on line 28 prevents a high output from the redundant decoder 15.

On the other hand, if the redundant row A is to be used, the buffers 21 through 23 are selected for programming. When the $R_A$ signal is high, fuse 31 is blown and line 28 is thereafter coupled to ground through transistor 30. The low signal on line 28 assures that decoder 15 may be selected when the appropriate address is applied to the buffers 21 through 23.

The decoder 16 is coupled to receive a similar signal on line 33. Line 33 is coupled to $V_{pp}$ through a fuse, which fuse is blown when $R_B$ is high. Similarly, the programmable circuitry associated with each redundant row line includes a circuit receiving an "R" signal.

It may be found that after the selection of a redundant row, the redundant row includes a faulty cell, and thus, should be discarded. While not used in the presently preferred embodiment, a circuit such as shown within dotted line 37 of FIG. 1 may be coupled to each of the redundant row decoders, to allow deselection of a selected redundant row. A "redundant disregard" signal, on line 36 provides permanent deselection of the decoder 16. The RDS signal which controls MOS device 38 is generated from the second address signals and the CE/ signal, in a manner similar to the generation of the $R_A$ signal described below.

Line 36 is coupled to an inverter comprising transistors 40 and 41. The gate of transistor 41 is coupled to $V_{pp}$ through fuse 42. This fuse is coupled to ground through the parallel combination of transistors 38 and 39. If the fuse 42 remains intact, transistor 41 will conduct and line 36 will be kept at ground potential. This will allow the decoder 16 to operate normally. On the other hand, if the row B has been selected and found to be faulty, a signal (RDS) will be applied to the gate of transistor 38, thereby blowing fuse 42. This will be keep line 36 permanently high since transistor 41 will not conduct. (Line 36 is clamped to $V_{cc}$ through transistor 40.) This, in turn, will prevent the selection of the redundant row line and allow another redundant row line to be selected to replace a faulty row line.

In the present invention, for purposes of programming the redundancy circuitry, the Y-line addresses (e.g., bit line addresses) are used for selecting groups of programmable buffers. This permits selection with no extra package pins. The number of the Y-line address bits required for programming is a function of the number of redundant lines in the memory. If, for example, the memory includes four redundant lines, two Y-address bits are necessary to select each group of buffers for programming. However, in the presently preferred embodiment, one additional Y-line address is used to provide a distinct programming address for the permanent disabling (repair inhibit) of the programming circuitry for the redundant rows.

For the described example where two redundant rows are used, two address signals are required, shown in FIG. 2 as $A_{y0}$ and $A_{y1}$ (and their complements). A different combination of each of these address signals is coupled to each of the NOR gates 46, 47 and 48 so as to enable individual selection of each of these gates by a different combination of these two Y-address signals. For example, when $A_{y0}$ and $A_{y1}$ are low, gate 46 may be selected. The gates 46, 47 and 48 also receive as an input, the $CE_x$ signal (line 61). The gates 46 and 47 additionally receive as an input the repair inhibit signal (line 59).

The CE/ signal (chip enable) in addition to its normal function, is also coupled to the inverter 63. The output of the inverter 63 is coupled to the inverter 64, and the output of the inverter 64 is coupled to the inverter 65. The output of the inverter 65, (line 61) provides the $CE_x$ signal. The inverter 63 is a low ratio inverter, that is, the depletion mode transistor has a large width-to-length channel ratio, while the enhancement mode transistor has a small width-to-length channel ratio. In order to have a low output from the inverter 63, CE/ must be brought higher than its normal potential of 5 volts. Thus, to initiate the programming of the redundancy circuitry, the CE/ signal is brought above 5 volts (e.g., 9 V). This causes a low output fron inverter 63, a high output from inverter 64 and a low output from inverter 65. With the $CE_x$ signal low, the outputs of the gates 46, 47 and 48 may be brought high if the other inputs to these gates are low. During normal operation of the memory, $CE_x$ is high preventing programming. However, as will be discussed, other means are used to assure that programming does not inadvertently occur even if CE/ is brought above 5 volts.

Initially during the programming process the output of gate 48 is maintained low. This prevents transistor 53 from conducting and couples the gate of transistor 57 to $V_{pp}$ through the fuse 55. Line 59 is thus clamped to ground potential providing a low input to gates 46 and 47. Then, with the appropriate Y-address, gate 46 may be selected; the RA signal is brought high and through inverter 50 the RA/ signal is brought low. Referring briefly to FIG. 1, with $R_A$ high and RA/ low, the buffers 21 through 23 may now be programmed (as will be described) and fuse 31 is blown.

Next, with $A_{y0}$/ low and $A_{y1}$ low, gate 47 is enabled such that $R_B$ is high and through inverter 51 $R_B$/ is low. This enables the programming of the programmable buffers 24 through 26 of FIG. 1.

After the programmable buffers have been programmed, the $A_{y0}$/ and $A_{y1}$/ signals are brought low causing the output of gate 48 to rise. Transistor 53 then conducts blowing fuse 55. This clamps the gate of transistor 57 to ground through transistor 54 and causes the repair inhibit signal to be clamped to $V_{cc}$ through transistor 56. Once this occurs, a high output can never again occur from gates 46 and 47 and thus, none of the programmable buffers can again be programmed. This prevents a user from inadvertently programming the buffers even if the CE/ signal is raised in potential. Care, of course, must be taken in the sequencing of the programming operation to assure that a high output does not occur from the gate 48 until all the desired programming has been completed.

Referring now to FIG. 3, a typical programmable buffer such as the buffer 21 of FIG. 1 is shown. This buffer receives the $A_5$ signal on the gate of transistor 69 and on the drain terminal of transistor 81. The RA/ signal is applied to the gate of transistor 70 and thereby couples the gate of transistor 72 to ground. This gate is also coupled to $V_{pp}$ (or $V_{cc}$) through the depletion mode transistor 68. It is apparent that during the programming of the buffer of FIG. 3, if RA/ is low (that is the buffer has been selected for programming) and if $A_5$ is low, fuse 71 will be blown since transistor 72 conducts. In that event, transistor 73 will clamp node 74 to ground potential.

If node 74 is at ground potential, the inverter comprising transistor 75 and 76 will provide a high output on line 77 which is coupled to the gate of the zero threshold device 81. This potential is also coupled to the inverter comprising transistors 78 and 79. This high potential couples the gate of transistor 80 to ground. Thus, transistor 80 is not conducting, while transistor 81 conducts with the fuse blown. During operation of the memory, if $A_5$ is high, $T_5$ will be high. On the other hand, if $A_5$/ is high, $T_5$ will be low, thus, $T_5$ is low only when $A_5$ is low.

If during the programming, $A_5$ is high, transistor 69 conducts preventing transistor 72 from conducting. After the programming, node 74 is kept permanently high through the fuse 71. This causes transistor 76 to always conduct the clamps line 77 low. The output of the next inverter stage is high, causing transistor 80 to conduct. With transistor 80 conducting, $T_5$ follows the $A_5$/ signal.

Figure 4:
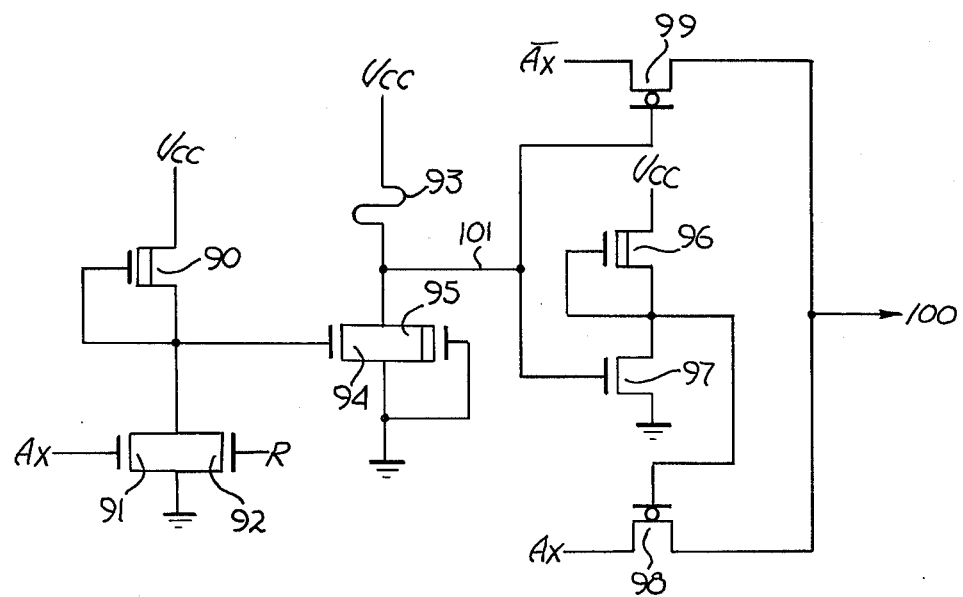
FIG. 4 is an electrical schematic of an alternate embodiment of the buffer of FIG. 3.

In some memories, particularly in RAMs, $V_{pp}$ is not used. In these cases, one less stage of inversion is used for the programmable buffer. Referring now to FIG. 4, transistor 91 again receives the "A" address signal and transistor 92 the R/ signal. The gate of transistor 94 is again pulled high through transistor 90 if neither transistor 90 nor 92 conducts. This blows the fuse 93 in an identical manner to the fuse 71 of FIG. 3. Again referring to FIG. 4, if the fuse 93 is blown, node 101 is pulled to ground through transistor 95. With node 101 low, transistor 99 does not conduct and transistor 96 pulls the gate of transistor 98 high, causing the line 100 to follow $A_x$. On the other hand, if the fuse is intact, node 101 is high causing transistor 99 to conduct. The high potential on node 101 causes transistor 97 to conduct pulling the gate of transistor 98 to ground, thereby preventing it from conducting. Line 100 then follows $A_x$/.

Assume that a faulty row in the array has been found or faulty cells along a row have been found and that the address for the row $A_5$ through $A_{13}$ is all binary ones. Further assume that redundant row A is to be programmed to replace the faulty row. $A_{y0}$ and $A_{y1}$ are brought low to bring $R_A$ high blowing fuse 31 and allowing programming of the buffers 21 through 23. All the programmable buffers 21 through 23 (and the others for the addresses $A_7$ through $A_{12}$) are programmed such that their outputs are low when $A_5$ through $A_{13}$ are high. In the case of the buffer of FIG. 3, this requires that the $T_5$ signal follow $A_5$/, that is, transistor 80 must conduct. To have transistor 80 conducting as previously explained, the fuse must remain intact. This further means that during programming $A_5$ through $A_{13}$ reamin high so that the fuses in the buffer are not blown.

During programming for each redundant decoder all the address lines $A_5$ through $A_{13}$ are first kept high to prevent any fuses from blowing. Then the signals are lowered one at a time when needed in order that only a single fuse is blown at one time. This prevents damaging the circuitry on the chip with excessive current. Put more simply, the rows addressed are changed from all logical ones to the address of the defective row, one address bit at a time.

For each redundant row line which is to be used, the correct Y-address is applied to allow the programming of the buffer associated with that row line. Then, with the correct Y-address, the repair inhibit fuse 55 is blown preventing any additional programming.

Figure 5:
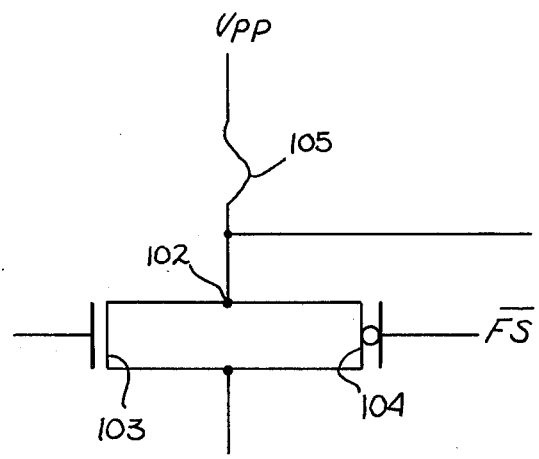
FIG. 5 is a circuit diagram of another embodiment of a fuse blowing circuit.

Referring now to FIG. 5, another embodiment for the fuse blowing circuitry shown in FIGS. 1 through 4 is illustrated. The circuit of FIG. 5, by way of example, is intended to replace transistors 29 and 30 and fuse 31 of FIG. 1, as well as the other fuse blowing circuits shown in FIGS. 1, 2, 3, and 4. The fuse blowing circuit of FIG. 5 includes a fuse 105 which may be the same as the polysilicon fuses previously described. The fuse 105 is coupled in series with a parallel combination of an enhancement mode field-effect transistor 103 and a field-effect transistor 104. The field-effect transistor 104 has a threshold voltage of approximately 0 volts. Such transistors are known in the prior art and easily fabricated, for example, by adjusting the doping level in the channel of the transistor. Transistor 104 is relatively small when compared to transistor 103. To blow the fuse 105, a potential of $V_{cc}$ is applied to the gate of transistor 104 and transistor 103 is turned-on. The large current drawn by transistor 103 causes the fuse to blow. This is analogous to the current drawn through transistor 29 of FIG. 1 which causes fuse 31 to blow. During normal operation, the gate of transistor 104 is coupled to $V_{cc}$ and this transistor serves the same function as, for example, transistor 30 of FIG. 1, that is, it keeps node 102 at ground potential when the fuse 105 is blown.

The advantage to the circuit of FIG. 5 is that it allows the resistance of a blown fuse to be checked to assure that the fuse is blown. When such fuses are blown, they do not always completely open and the remaining material has sufficiently low resistance to cause a problem. When this occurs, node 102 may not be drawn to ground potential as it should be.

Assume that fuse 105 is blown, however, not completely and that it has a resistance after being blown of approximately 100,000 ohms. To check the resistance of a blown fuse, the fuse screen potential (FS/) is dropped to approximately 0.5 to 0.7 volts. At this potential, transistor 104 only slightly conducts, and node 102 will rise toward the potential applied to the fuse which is typically $V_{cc}$ for testing. Thus, by applying a relatively low potential to the transistor 104 and like transistors, and by sensing the potential on node 102, the effectiveness of the fuse blowing step can be checked.

In another embodiment, transistor 104 may be replaced by a depletion mode transistor. During normal operation its gate would be held at ground potential. To check the resistance of a blown fuse, its gate would be taken to a negative potential where the depletion mode transistor would conduct only slightly.

In the above-discussed embodiments, a fuse is used for programming the decoders and the other circuits requiring programming. A nonvolatile memory cell can also be used for this purpose in some applications. Cells are particularly useful and easy to fabricate when the entire memory consists of such cells. In some cases, however, these cells are not practical. For example, where an EPROM memory is fabricated using cells which are erasable with ultraviolet light, the redundancy program into the memory will be lost when the memory is erased. On the other hand, where a memory consists of electrically erasable nonvolatile cells, the memory array can be erased without erasing the programmed redundancy.

FIG. 6 illustrates a circuit which may be used to replace a fuse and a fuse blowing circuit of FIGS. 1 through 4. Comparing FIGS. 3 and 6, the transistors 106, 107 and 108 of FIG. 6 correspond to transistors 68, 69 and 70 of FIG. 3. This circuit to the right of the dotted line 109 replaces the fuse 71 and the transistors 72 and 73 of FIG. 3. The signal on line 74 is equivalent to the signal on line 115 except that the signal on line 115 is the complement of the signal on line 74.

The circuit to the right of line 109 of FIG. 6 includes an electrically erasable and electrically programmable memory cell 111. Typically, such cells also include a transistor coupled in series with the cells such as transistor 113. The presently preferred embodiment for this nonvolatile memory cell is described in U.S. Pat. No. 4,203,158. A transistor 112 is coupled in parallel with the cell 111. The transistor 113 is coupled to $V_{cc}$ through the depletion mode transistor 114. The circuit of FIG. 6 operates in the same manner as the circuits of FIGS. 3 and 4, except that rather than blowing a fuse, charge is transferred onto the floating gate of the cell 111.

Thus, a redundancy apparatus for a single chip memory has been described. No additional pins are required to program the redundancy circuitry and such programming may take place once the chip has been packaged. Once programming has been completed, the programming circuit is disabled, preventing inadvertent programming.

We claim:

1. In a memory which includes first lines selected by first address signals and second lines selected by second address signals, an improved redundancy apparatus comprising:

a plurality of redundant first lines;

programmable decoder means for selecting said redundant first lines upon receipt of predetermined ones of said first address signals, said decoder means being programmed to recognize said predetermined first address signals and, wherein said decoder means includes fuses which are coupled in series with parallel combinations of two transistors one of which has a threshold voltage of substantially zero volts;

selection means coupled to receive at least a portion of said second address signals for selection of said decoder means during said programming and for disabling programming of said decoder means upon receipt of certain signals;

whereby said memory is programmed to use said redundant lines, and then programmed to prevent inadvertent programming.

2. In a memory which includes first lines selected by first address signals and second lines selected by second address signals, an improved redundancy apparatus comprising:

a plurality of redundant first lines;

programmable decoder means for selecting said redundant first lines upon receipt of predetermined ones of said first address signals, said decoder means beingprogrammed to recognize said predetermined first address signals, and wherein said decoder means include electrically erasable and electrically programmable memory cells for said programming;

selection means coupled to receive at least a portion of said second address signals for selection of said decoder means during said programming and for disabling programming of said decoder means upon receipt of certain signals;

whereby said memory is programmed to use said redundant lines, and then programmed to prevent inadvertent programming.

3. The apparatus defined by claim 1 or 2 wherein said selection means blows a fuse upon said receipt of said certain signals.

4. The apparatus defined by claim 3 wherein said certain signal is a predetermined second address.

5. The apparatus defined by claim 4 wherein said decoder means includes polysilicon fuses which are selectively blown.

6. The apparatus defined by claim 5 wherein said blowing or leaving intact said polysilicon fuses in said decoder means enables the selection of either a true one of said first address signals or the complement of said one of said first address signals.

7. The apparatus defined by claim 6 including means for deselecting a faulty one of said redundant lines.

8. In a memory which includes a plurality of array decoders coupled to receive first address signals and a plurality of array lines selected by said array decoders, an improved redundancy apparatus comprising:
  a plurality of redundant lines;
  a plurality of redundant decoders for selecting said redundant lines, said redundant decoders coupled to said array decoders so as to prevent selection of said array lines upon selection of one of said redundant lines;
  programmable gating means coupled to receive said first address signals, for programming to provide predetermined first address signals to said redundant decoders and wherein said gating means includes fuses which are coupled in series with parallel combinations of two transistors one of which has a threshold voltage of substantially zero volts;
  selection means coupled to receive second address signals for selecting said gating means during said programming of said gating means; and
  repair inhibit means for preventing said programming of said gating means, said repair inhibit means coupled to receive said second address signals and being activated by predetermined second address signals;
  whereby said memory may be programmed to replace faulty lines with said redundant lines and then inhibited from inadvertent programming.

9. The apparatus defined by claim 8 wherein said gating means includes polysilicon fuses which are selectively blown.

10. The apparatus defined by claim 9 wherein said blowing of said polysilicon fuses controls selection of true and complement ones of said first address signals.

11. The apparatus defined by claim 8 wherein said repair inhibit means includes a polysilicon fuse which is blown for said preventing of said programming.

12. The apparatus defined by claim 8 including means for deselecting a faulty one of said redundant lines.

13. In a memory which includes a plurality of array decoders coupled to receive first address signals and a plurality of array lines selected by said array decoders, an improved redundancy apparatus comprising:
  a plurality of redundant lines;
  a plurality of redundant decoders for selecting said redundant lines, said redundant decoders coupled to said array decoders so as to prevent selection of said array lines upon selection of one of said redundant lines;
  programmable gating means coupled to receive said first address signals, for programming to provide predetermined first address signals to said redundant decoders, and wherein said gating means includes electrically erasable and electrically programmable memory cells for said programming;
  selection means coupled to receive second address signals for selecting said gating means during said programming of said gating means; and
  repair inhibit means for preventing said programming of said gating means, said repair inhibit means coupled to receive said second address signals and being activated by predetermined second address signals;
  wherein said memory may be programmed to replace faulty lines with said redundant lines and then inhibited from inadvertent programming.

14. The apparatus defined by claim 13 wherein said gating means includes polysilicon fuses which are selectively blown.

15. The apparatus defined by claim 14 wherein said blowing of said polysilicon fuses controls selection of true and complement ones of said first address signals.

16. The apparatus defined by claim 13 wherein said repair inhibit means includes a polysilicon fuse which is blown for said preventing of said programming.

17. The apparatus defined by claim 13 including means for deselecting a faulty one of said redundant lines.

* * * * *

UNITED STATES PATENT AND TRADEMARK OFFICE
CERTIFICATE OF CORRECTION

PATENT NO. : 4,441,170

DATED : Apr. 3, 1984

INVENTOR(S) : Folmsbee et al.

It is certified that error appears in the above-identified patent and that said Letters Patent is hereby corrected as shown below:

| COLUMN | LINE | |
|---|---|---|
| 5 | 14 | Please delete "fron" and insert --from--. |

Signed and Sealed this

First Day of July 1986

[SEAL]

Attest:

DONALD J. QUIGG

Attesting Officer    Commissioner of Patents and Trademarks